United States Patent [19]

Enloe et al.

[11] Patent Number: 5,250,130
[45] Date of Patent: Oct. 5, 1993

[54] REPLICA HOT PRESSING TECHNIQUE

[75] Inventors: Jack H. Enloe, Columbia; John W. Lau, Gaithersburg, both of Md.

[73] Assignee: W. R. Grace & Co.-Conn., New York, N.Y.

[21] Appl. No.: 702,562

[22] Filed: May 20, 1991

Related U.S. Application Data

[63] Continuation-in-part of Ser. No. 286,557, Dec. 19, 1988, Pat. No. 5,017,434, which is a continuation-in-part of Ser. No. 148,829, Jan. 27, 1988, Pat. No. 4,920,640.

[51] Int. Cl.$^5$ .................... C04B 37/00; B32B 18/00
[52] U.S. Cl. ................................ 156/89; 156/289; 264/57; 264/60; 264/61; 264/319; 419/48
[58] Field of Search ............... 156/89, 289; 264/60, 264/125, 56, 57, 319, 61; 419/48

[56] References Cited

U.S. PATENT DOCUMENTS 5,085,720  2/1992  Mikeska et al. ................ 156/89

Primary Examiner—Jan H. Silbaugh
Assistant Examiner—Christopher A. Fiorilla
Attorney, Agent, or Firm—Steven Capella

[57] ABSTRACT

A green body to be hot pressed by heating the body and applying pressure in a uniaxial direction to the body for an amount of time wherein the body has at least one non-uniform composition cross section relative to the uniaxial direction which cross section has regions which require differing amounts of shrinkage in the uniaxial direction to achieve maximum density under the pressure and heating for the amount of time, may be hot pressed according to a method including:
a) laminating auxiliary material with the green body in the uniaxial direction wherein the auxiliary material includes at least one non-uniform composition cross section relative to the uniaxial direction which cross section has regions which require differing amounts of shrinkage in the uniaxial direction to achieve maximum density under the pressure and heating for the amount of time, whereby the net uniaxial shrinkage required by the laminate to achieve maximum density under the heating and pressure for the amount of time is substantially equal across the laminate;
b) hot pressing the laminate to densify the body; and
c) delaminating the auxiliary material from the densified body.

19 Claims, 9 Drawing Sheets

REPLICA HOT PRESSING TECHNIQUE

This application is a continuation-in-part of application Ser. No. 286,557, filed Dec. 19, 1988, now U.S. Pat. No. 5,017,434 which is a continuation-in-part of U.S. patent application no. 148,829, filed Jan. 27, 1988, now U.S. Pat. No. 4,920,640.

BACKGROUND OF THE INVENTION

Uniaxial hot pressing is a method of forming densified objects by heating and applying uniaxial pressure against a material such as a powder preform or compact. Hot pressing has been used with a variety of powder materials such as metals, ceramics and combinations thereof.

In a hot pressing process, the material to be hot pressed is usually placed into a die and pressure is then applied by a ram or platen which presses against the material directly or indirectly through some intermediate material. Hot pressing applications have generally been limited to forming shapes presenting flat surfaces and uniform cross sections relative to the direction of uniaxial pressure.

Non-uniform cross sections (relative to the direction of uniaxial pressure) react non-uniformly, and often unpredictably, to the applied pressure and heat. If a cross section contains regions of different materials (i.e., a non-uniform cross section), those materials may undergo differing amounts of shrinkage relative to the axial direction. The region that stops shrinking first may assume the entire applied pressure, thus stopping the platen or ram from traveling further and from applying pressure to the other regions. Those other regions may not fully densify because of this lack of applied pressure.

If a surface of the object to be densified is not flat and uniform in thickness (e.g. has a cavity, ridge, step, etc.), hot pressing with a flat ram or platen may cause lateral deformation or distortion of the surface features. Attempts have been made to use rams shaped to correspond to the steps or cavities in the object. These efforts have been largely unable to achieve uniform density in the resulting object without distortion of surface features.

SUMMARY OF THE INVENTION

The present invention provides a method for uniaxially hot pressing shapes having non-uniform composition and/or shapes having surface cavities or steps facing the uniaxial direction.

The invention provides a method of hot pressing a green body by heating the body and applying pressure in a uniaxial direction to the body for an amount of time wherein (i) the body has at least one non-uniform cross section perpendicular to the uniaxial direction and (ii) the non-uniform cross section has regions which require differing amounts of shrinkage in the uniaxial direction to achieve maximum density under the pressure and heating for the amount of time, the method comprising:

a) laminating auxiliary material with the green body in the uniaxial direction wherein (i) the auxiliary material comprises at least one non-uniform cross section perpendicular to the uniaxial direction and (ii) the auxiliary material non-uniform cross section has regions which require differing amounts of shrinkage in the uniaxial direction to achieve maximum density under the pressure and heating for the amount of time, whereby the net uniaxial shrinkage required by the laminate to achieve maximum density under the heating and pressure for the amount of time is substantially equal across the laminate;

b) hot pressing the laminate to densify the body; and c) delaminating the auxiliary material from the densified body.

The green body and auxiliary material are preferably preforms. The green body preform may contain one or more non-uniform layers having regions of differing compositions. The auxiliary material preform preferably has at least one layer having regions sectioned in the same way as the green body non-uniform layer except that the different compositions are switched between regions. The compositions may contain metals, ceramics, or mixtures thereof.

The invention also includes embodiments where the auxiliary material is applied as two separate preforms laminated on opposite sides of the green body preform.

DETAILED DESCRIPTION OF THE INVENTION

Figure 1:
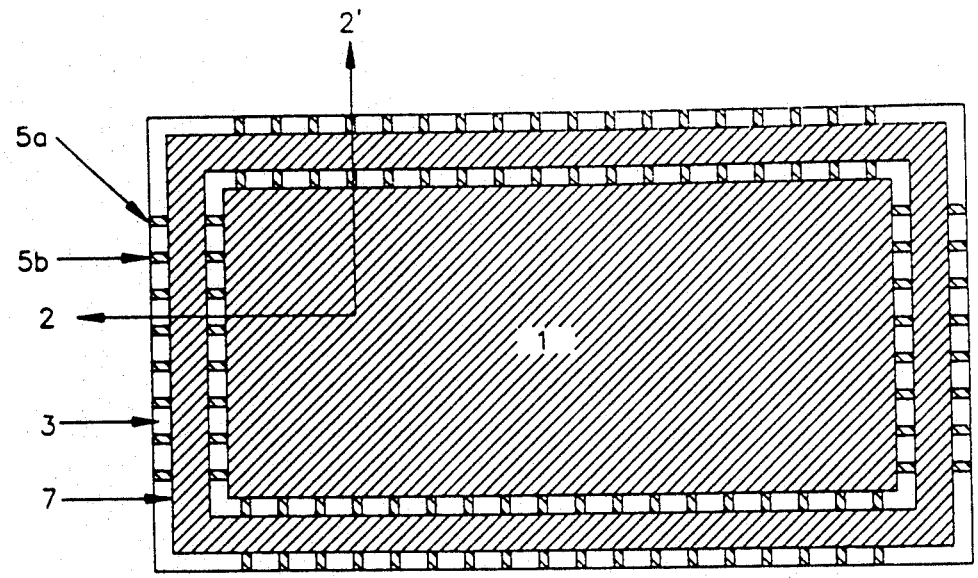
FIG. 1 is a plan view of an electronic package.

The hot pressing technique of the invention involves the steps of A) assembling a configuration of powder(s) to be densified (a green body), B) assembling a configuration of auxiliary material adapted to compensate for shrinkage differentials in cross section(s) of the green body, C) hot pressing the green body - auxiliary material combination, and D) separating the hot pressed body from the auxiliary material.

The green body may contain material regions which are already in a densified state prior to assembly. The green body may contain powder materials (non-sinterable materials) which are not in a densified state and do not densify appreciably under the hot pressing conditions used to densify the particular green body.

The technique of the invention can be used to densify ceramic powders, metal powders and mixtures of ceramic and metal powders. The invention is described below with respect to ceramic powders and hot pressing green body preforms to form a metallized ceramic base for an electronic package, however it should be understood that the invention is not limited to hot pressing ceramic powders nor to forming bases for electronic packaging. Metal-based bodies or cermet bodies can be made by similar methods with appropriate substitution of the desired powders.

For a ceramic-containing body, a green body may be prepared from any desired ceramic powder(s). Typically, the ceramic powder(s) would be combined with a suitable binder. The powder-binder mixture(s) would then be formed into a green body preform. The binder in the green body preform is preferably removed or reacted after the green body preform and auxiliary material are assembled. While the invention is not limited to any manner of making the green body or green body preforms, preferably the powder-binder mixture(s) is formed into a green tape(s) that can be cut, laminated and/or abutted to form the green body preform.

If a surface cavity structure or step structure were desired in the ceramic body to be produced, then the surface layer(s) of the preform would contain a region of material which was substantially non-sinterable under the hot pressing conditions used. The non-sinterable region would abut the green ceramic regions in the layer corresponding to the step or walls of the cavity in the ceramic body. The non-sinterable region(s) could then be removed after hot pressing to achieve the desired surface features.

If a layer having dense regions of differing compositions is desired, different green ceramic compositions would be prepared and discrete regions of the green layer would contain different green ceramic compositions. (Methods for forming non-uniform layers using non-sinterable compositions or differing green ceramic compositions are discussed further below.) The non-uniform layer may be partially or completely buried in the interior of the body only if the following condition is met in the green body preform: the interregional boundaries in the buried layer must either a) be aligned with interregional boundaries in the layer(s) intermediate between the buried layer and surface of the green body facing the direction of uniaxial pressure, or b) be aligned with a non-sinterable region of the intermediate layer(s). This condition must be satisfied for each buried non-uniform layer in the green body with respect to at least one cross sectional surface of the body.

Figure 13:
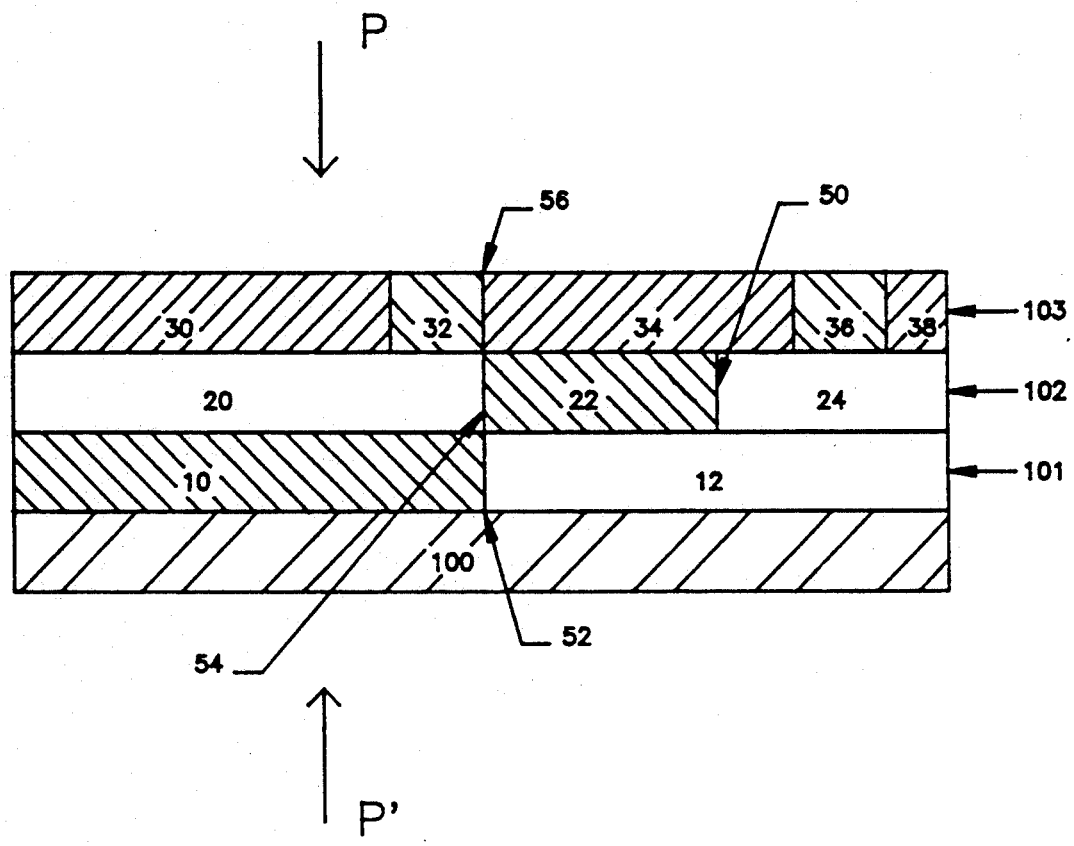
FIG. 13 shows an example of some permissible green body layer configurations according to the invention.

Some permissible green layer configurations are illustrated in FIG. 13. Regions 10 and 22 are made of one sinterable material whereas regions 12, 20 and 24 are made of a different sinterable material. Layer 100 may be a dense ceramic base or a sinterable ceramic. Regions 30, 34 and 38 are made of a non-sinterable material. Regions 32 and 36 are made of a third sinterable material. Arrows P,P' show the direction of applied uniaxial pressure.

Layer 101 is permissible because interregional boundary 52 is aligned with interregional boundaries 54 and 56. Meeting these conditions in both directions (i.e. toward layer 100) is not necessary.

Layer 102 can be similarly analyzed with respect to layer 103. Namely, boundary 50 is aligned under non-sinterable region 34 and boundary 54 is aligned with boundary 56. Layer 103 is permissible since it is not a buried layer.

The auxiliary material provides a uniaxial shrinkage profile that cancels out the shrinkage differential of the green body at every point across the cross section of the green body - auxiliary material laminate. In this way, the net uniaxial shrinkage to achieve maximum density, under given hot pressing conditions, is substantially the same across the entire laminate.

In order to perform this cancellation function, the auxiliary material preferably is formed of the same materials as the green body preform. The auxiliary material preferably contains one or more layers of those materials in different regions such that the net combination of material layers is the same in the uniaxial direction at every point for the green body-auxiliary material laminate.

The auxiliary material is laminated to the surface of the green body in the direction that satisfies the buried layer criteria discussed above. If the buried layer criteria are met by both sides of the green body perpendicular to the uniaxial direction, then auxiliary material would be applied to both sides. If there are no non-uniform buried layers, then the auxiliary material would be applied to sides of the green body where there is a non-uniform surface layer.

The construction of the auxiliary material itself must also satisfy the buried layer criteria with respect to its lamination interface with the green body. Otherwise, intermediate layers of the auxiliary material could prevent other parts of the auxiliary material from performing the cancellation function.

An appropriate auxiliary material may be constructed from the following approach which will be illustrated by the FIGS. 13-14 further below.

Starting with the auxiliary material layer closest to the lamination interface, one constructs the first layer of the auxiliary material to address cancellation of differences in the uppermost layer (surface layer) of the green body. A general rule of construction is that the compensating auxiliary material layer would contain the same materials as the particular layer of the green body and would be sectioned in an identical configuration except with the materials interchanged. There are exceptions to this general rule, namely:

1) the buried layer criteria must be met in the auxiliary material;

2) the interregional boundaries in the green body layers must be present in the auxiliary material layers as interregional boundaries or as an overlapping non-sinterable region until a layer has been assembled in the auxiliary material to compensate for the particular green body layer having those boundaries; and 3) if the green body layer contains more than two different compositions, then not all of those compositions can be compensated for in one auxiliary material layer.

If one of these exceptions prohibits the construction of the appropriate cancelling layer in the auxiliary material, then whatever portions that violate the exception would be replaced by non-sinterable material. The portions of the particular green body layer not compensated for because of this replacement would then be addressed by the next layer of the auxiliary material. Thus, whatever layers are needed to compensate for the surface layer of the green body would be assembled. The next layer inward from the green body surface would then be addressed by the further layers of the auxiliary material. In some cases, the uncompensated portion of one green body layers and the next inward green body layer may be addressed in the same auxiliary material layer.

Figure 14:
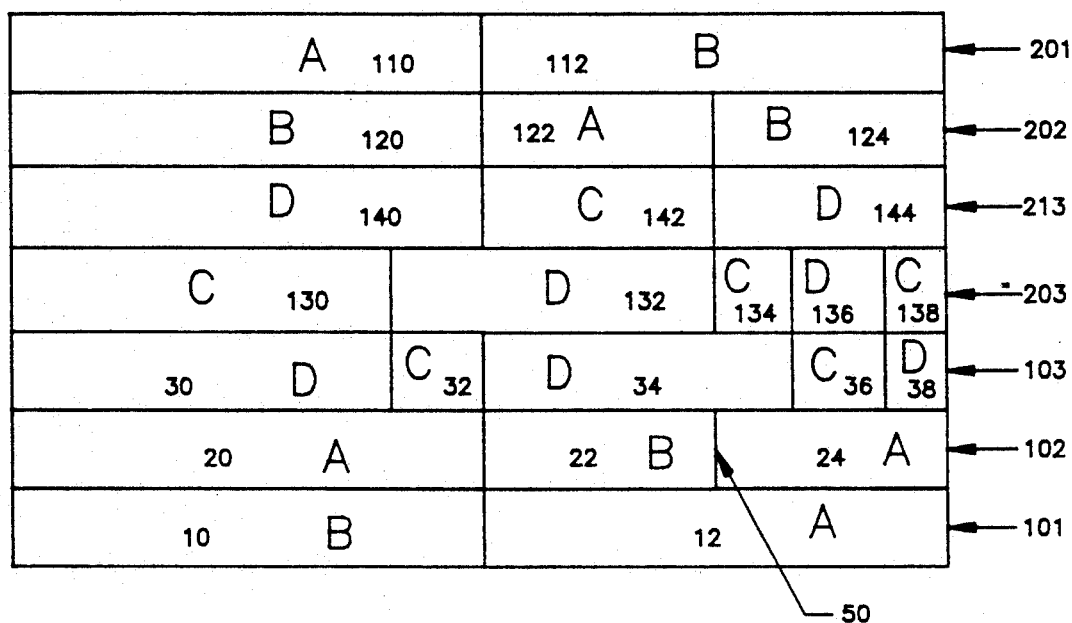
FIG. 14 shows the non-uniform layers of the green body of FIG. 13 with an appropriate auxiliary material configuration.

FIG. 14 shows the three non-uniform layers of the green body of FIG. 13. Base layer 100 would also be present in the green body preform to be hot pressed. For purposes of this illustration, the regions have been labeled as A,B,C or D. A, B, and C refer to different sinterable compositions. D refers to a non-sinterable composition. Layers 201, 202, 203 and 213 are layers of the auxiliary material which are provided to compensate for layers 101, 102 and 103.

In layer 203, sections 136 and 138 compensate for sections 36 and 38 in layer 103. Section 134 cannot cannot entirely compensate for section 34 because C is a sinterable material that would violate exception 2 above with respect to boundary 50 if it had the same dimensions as section 34. Note that section 132 is permissible because it is non-sinterable. The portion of section 34 that was not compensated for in layer 203 is compensated for by section 142 of layer 213. Sections 120, 122 and 124 of layer 202 compensate for sections 20, 22 and 24 of layer 102. Similarly, sections 110 and 112 of layer 201 compensate for sections 10 and 12 in layer 101.

It should be noted that several different appropriate auxiliary material configurations may be constructed for a particular green body configuration. For example, in FIG. 14, sections 110 and 140 could be interchanged as could sections 122 and 142. These permutations must still satisfy the various criteria discussed above.

The green ceramic compositions, used to form the various green layer regions, all preferably contain a combination of ceramic particles and a binder. For electronic packaging, polyethylene is a preferred binder since it is known to volatilize without leaving residue. For other ceramic bodies, conventional binders may be used. Techniques for forming polyethylene-based green layers are disclosed in U.S. Pat. No. 4,920,640 which is incorporated by reference.

The ceramic materials used for the sinterable regions may be any materials or combinations of materials which are compatible with each other and which densify under the hot pressing conditions used.

The selection of suitable non-sinterable materials follows similar compatibility and sinterability considerations. If the green ceramic to be densified is a glass or other relatively low temperature densifying material, then the non-sinterable materials may be any of a fairly broad range of ceramics that do not appreciably sinter at those temperatures. On the other hand, if the green ceramic to be densified is a ceramic such as alumina or aluminum nitride (which require more severe sintering conditions), then the non-sinterable materials available for those conditions are much more limited. Thus, only highly refractory materials such as BN or thoria may be available as non-sinterable materials. Wetting and reactivity of the non-sinterable material are among other compatibility factors to be considered in selecting an appropriate non-sinterable material. BN is generally preferred as a non-sinterable material.

Like the green ceramic to be densified, the non-sinterable material is preferably present initially (in the preform and/or the auxiliary material) in combination with a suitable binder.

The green body preform and the auxiliary material (replica) are preferably formed by laminating sheets of the various green ceramic (or non-sinterable material) - binder formulations. The sheets can be formed by any known method. For layers having regions differing composition, the green ceramic sheet of one composition is cut and an appropriate cutting from another green ceramic (or non-sinterable material) sheet is inserted. Often the sheet materials left over from the cuttings of the green body preform can be used as part of the auxiliary material preform.

Metallization can be placed in the green body preform by any conventional technique for forming metallization in ceramic bases for electronic packaging. Generally, the metallization is ignored for purposes of generating the appropriate auxiliary material. The metallization used in electronic packaging is generally a relatively small volume fraction of the body. In some cases, it may be desirable to take the metallization into account in generating the appropriate auxiliary material.

The green body preform and the auxiliary material preform may be laminated together in a single lamination step with lamination of the layers of the preforms. If desired, surface features or non-uniform composition layers can be formed on both faces of the green body perpendicular to the uniaxial direction. In such a situation, two appropriate replica preforms would be laminated against the respective faces of the green body preform.

It is important that the laminate has a good fit with the hot press die cavity since gaps at the die wall preform interface can result in substantial unwanted flow of material. Laminates can be hot pressed individually or in stacks separated by BN sheets (or other suitable material) and/or graphite spacers.

Hot pressing conditions depend on those required to densify the particular green ceramic layer(s). For borosilicate glass/AlN composites, hot pressing temperatures of 900°-1400° C. at 500-1000 psi for 1-2 hours are generally suitable densification conditions. For glasses or glass ceramics, temperatures below 1000° C. are generally preferred. For AlN ceramics, densification temperatures on the order of 1800° C. or greater may be needed. The selection of other time/temperature/pressure conditions may be necessary for other materials systems.

After hot pressing, the replica pieces forming the auxiliary material are easily removed from the top (and/or bottom) of the hot pressed body and the undensified non-sinterable material is removed from the hot pressed body surfaces by washing and/or light grit blasting. In some instances, some minor machining of the body edges may be necessary depending on the particular intended use.

The relationship between the green body and the auxiliary material can be seen with reference to FIGS. 1-12. While the following discussion and the drawings illustrate a particular ceramic base for an electronic package design, it should be understood that the invention is not limited to electronic packaging, any particular package design or any particular configuration of layers. Moreover, while the illustration refers to AlN, AlN-glass composites and BN, it should be understood that the invention is not limited to these materials. For purposes of this illustration, the metallization has been treated as having negligible impact on the hot pressing of the ceramic base.

Figure 2:
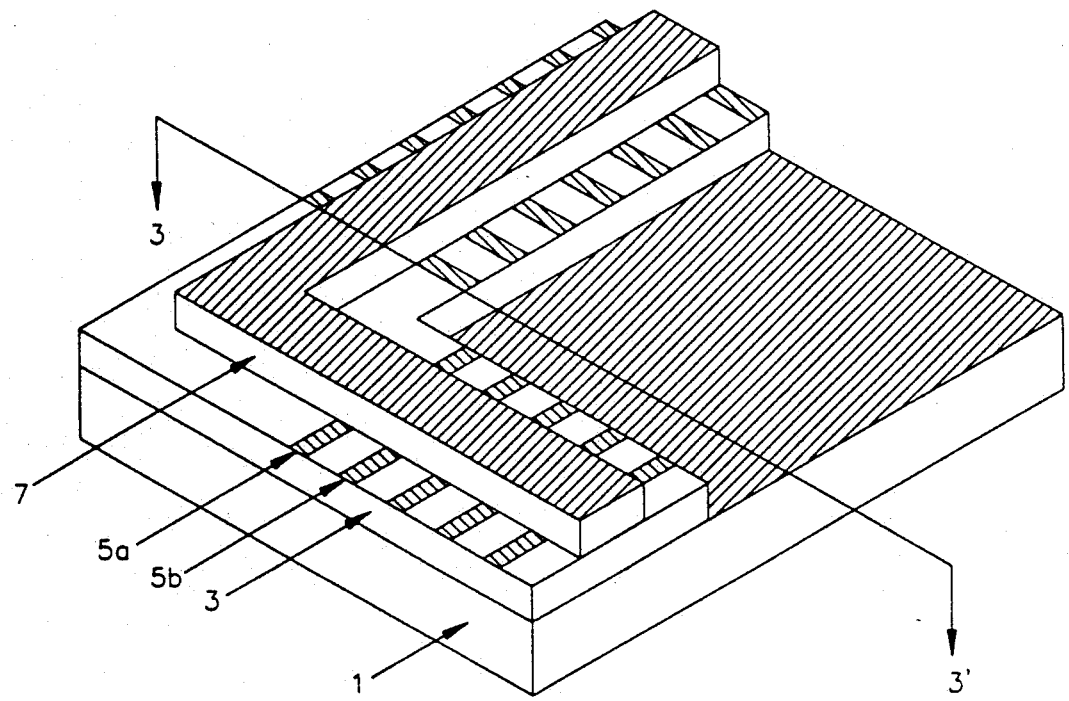
FIG. 2 is a magnified perspective view of a corner of the package of FIG. 1 taken along the line 2—2'.
Figure 3:
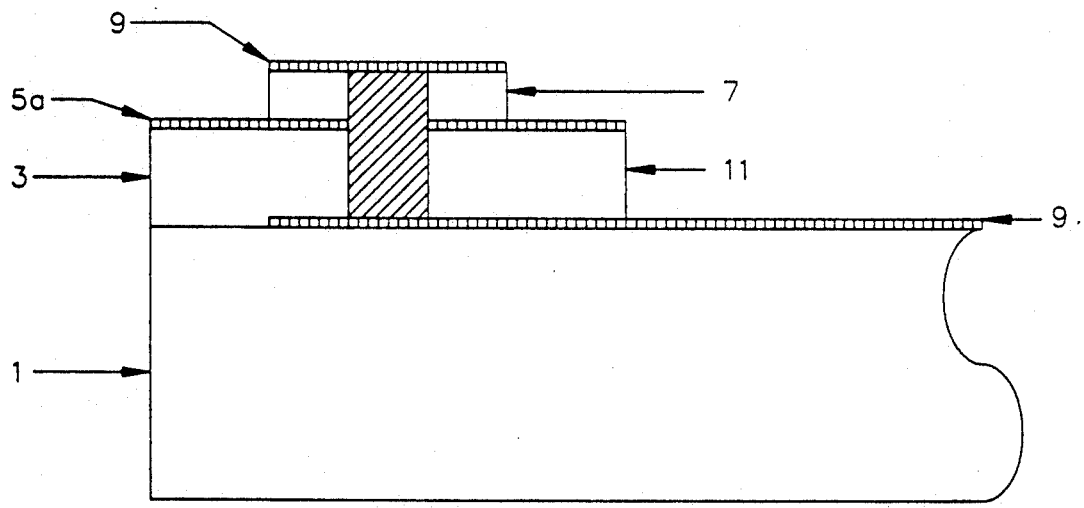
FIG. 3 is a magnified perspective view in section of FIG. 2 taken along the line 3—3', to show a via and metallization.

FIGS. 1-3 show views of the package in its densified state.

In FIG. 1, a densified AlN base with metallization is shown at 1. A densified AlN-glass composite layer lead frame 3 is bonded to AlN layer 1. A plurality of leads (metallization) 5a, 5b, etc., is shown on the surface of lead frame 3. A metallized seal ring 7, also of densified AlN-glass composite, is bonded to frame 3.

In FIG. 3, a via (metallization) is shown at 11 with lead and seal ring metallization (magnified) at 9.

FIGS. 4–12 show individual green layers and final assembly of a green body-auxiliary material laminate for hot pressing, to make the package of FIGS. 1–3, using the replica technique. Note again that the thickness of screened-printed metallization and the cross sectional area of vias are considered as negligible for this illustration.

Figure 4:
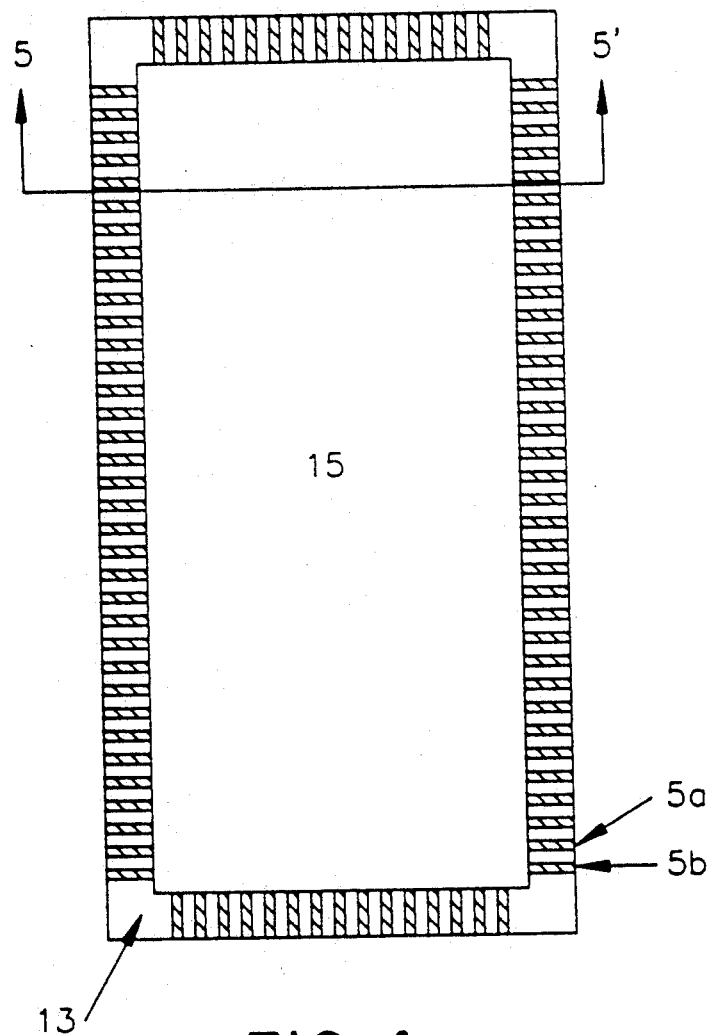
FIG. 4 is a plan view of a greenware lead frame.
Figure 5:
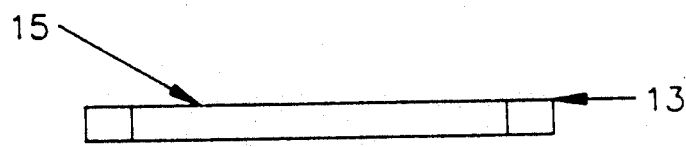
FIG. 5 is a section of the lead frame of FIG. 4 taken along the line 5—5'.

In FIGS. 4 and 5, a green lead frame layer is shown at 13, with screen-printed metallization leads 5a, 5b, etc. This frame 13 is a AlN-glass composite green layer. It encloses a green sheet (plug) of BN (non-sinterable material), 15. BN plug 15 is later removed after hot pressing to leave a cavity.

Figure 6:
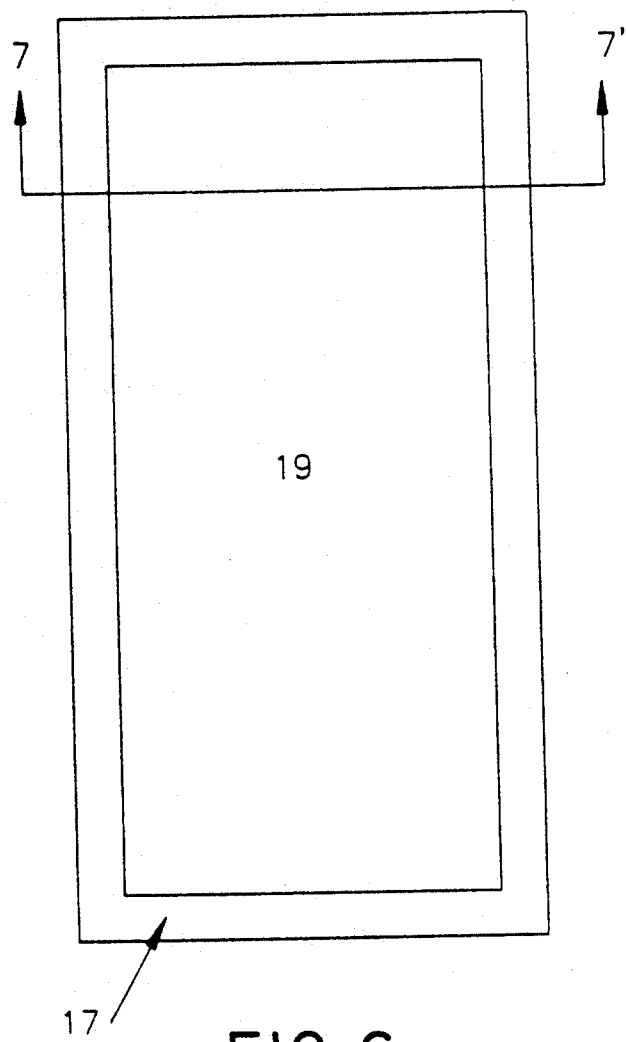
FIG. 6 is a plan view of a replicate for the lead frame of FIG. 4.
Figure 7:
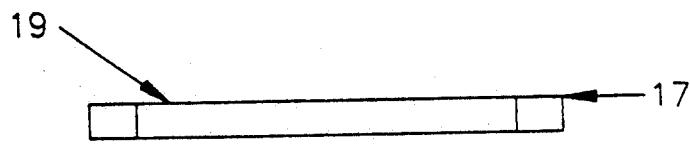
FIG. 7 is a section of the replicate of FIG. 6 taken along the line 7—7'.

FIGS. 6 and 7 show a replica for green lead frame 13 of FIG. 5. The replica, which forms part of the auxiliary material, consists of a green sheet (frame) of BN 17 enclosing a AlN-glass composite green layer (plug) 19.

Figure 8:
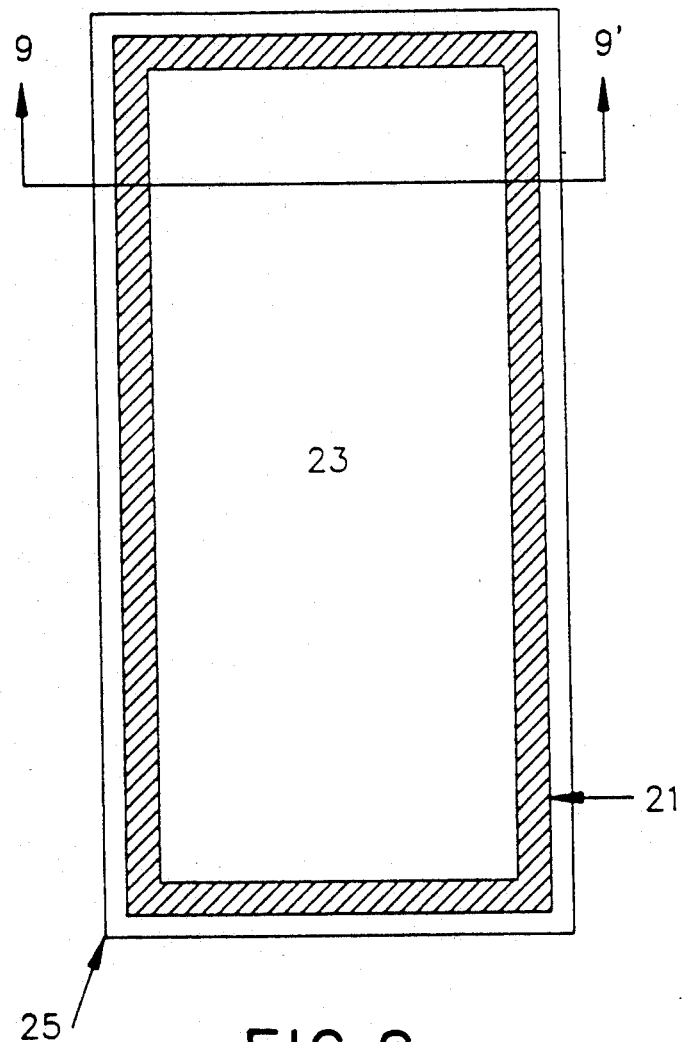
FIG. 8 is a plan view of a metallized greenware seal ring layer.
Figure 9:
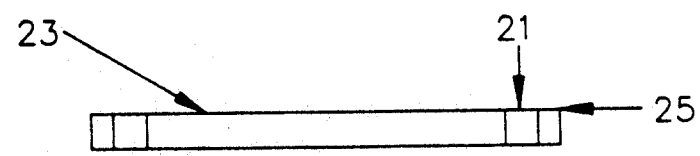
FIG. 9 is a section of the seal ring layer of FIG. 8 taken along the line 9—9'.

FIGS. 8 and 9 show a metallized AlN-glass composite green seal ring 21. This seal ring 21 encloses BN green sheet (plug) 23. Seal ring 21 is itself enclosed by BN green sheet (outside ring) 25.

Figure 10:
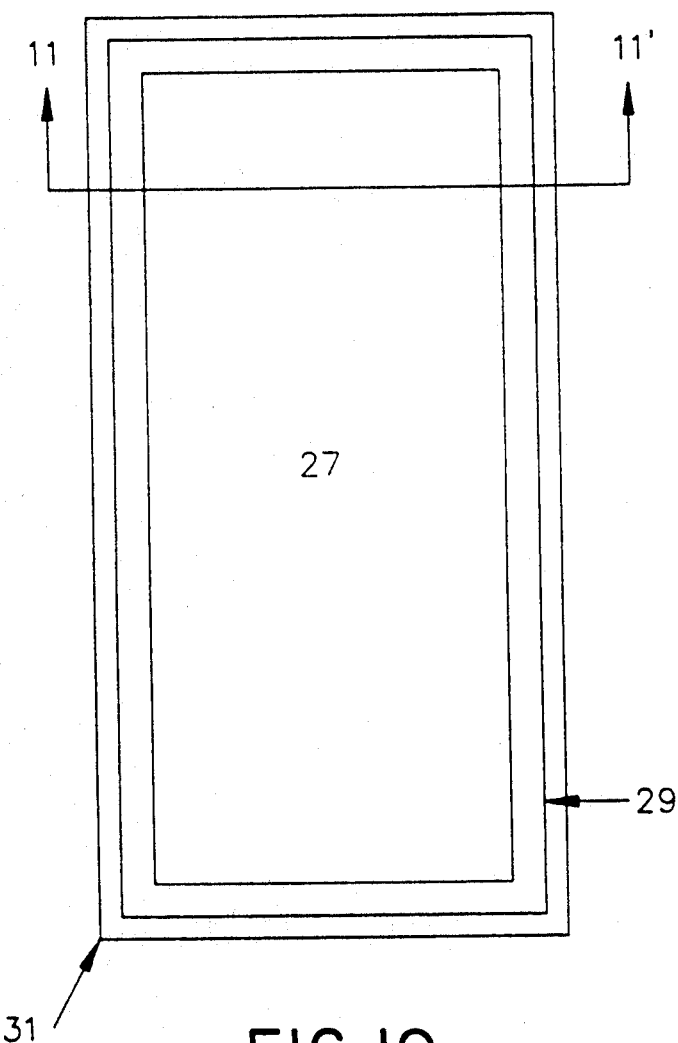
FIG. 10 is a plan view of a replicate for the seal ring layer of FIG. 8.
Figure 11:
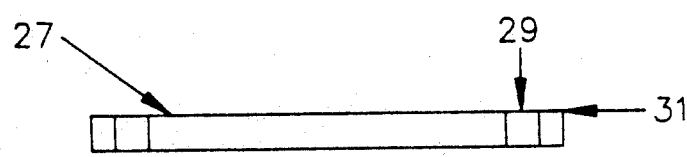
FIG. 11 is a section of the replicate of FIG. 10 taken along the line 11—11'.

FIGS. 10 and 11 show a replica of layer of FIG. 8. An AlN-glass composite green layer (plug) 27 is enclosed by a ring of BN green sheet 29, which is in turn enclosed by a ring of a AlN-glass composite green layer 31.

Figure 12:
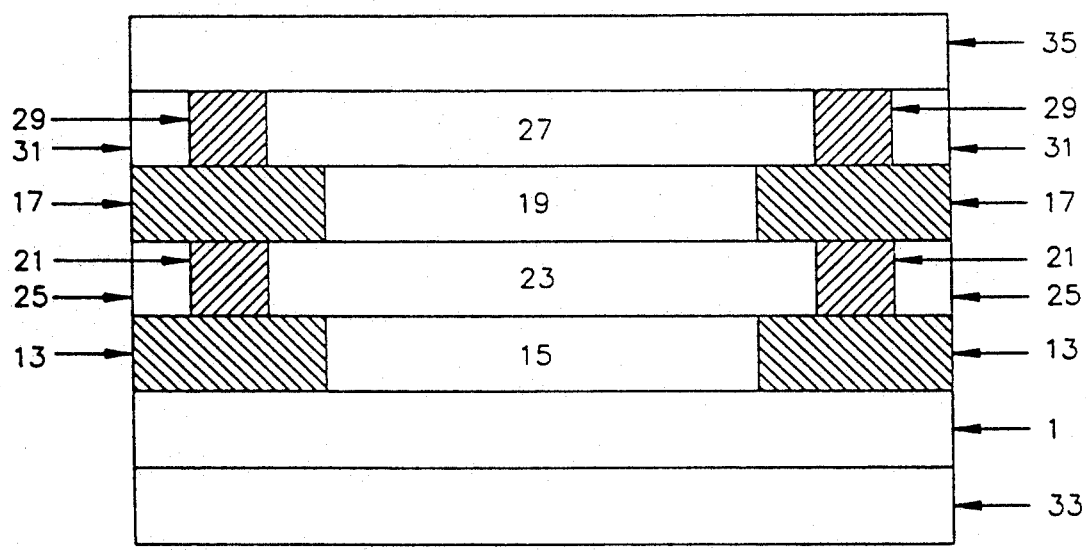
FIG. 12 is a schematic representation in section of a greenware laminate of the invention, with replicant layers. Vertical scale is exaggerated.

FIG. 12 shows a bonded laminate, comprising all the green body layers and auxiliary material layers described in FIGS. 4–11, assembled for hot pressing with lead frame 13 being laminated with dense AlN layer 1. A green layer of BN 33 is optional and may be used at high hot pressing temperatures to minimize reaction with graphite dies. Similarly, an overlayer of green BN 35 may be added. As with layer 33, layer 35 is also optional. Other suitable materials may be used in place of the protective BN sheets or the sheets may be omitted for certain systems.

The replica technique principle is illustrated in FIG. 12. There the differential in shrinkage between BN region 15 and AlN-glass composite region 13 is cancelled out by the differential shrinkage of BN region 17 and AlN-glass composite region 19 in the replica layer above. Similar cancellation occurs between regions 25 and 31, regions 23 and 27, and regions 21 and 29. Thus, the stack of regions in the direction of hot pressing includes 4 BN layers, 2 AlN-glass composite layers and the dense AlN base layer at all points across the green body-auxiliary material laminate.

What is claimed is:

1. A method of hot pressing a green body by heating and applying pressure in a uniaxial direction to said green body for an amount of time wherein said green body has at least one non-uniform composition cross section perpendicular to said uniaxial direction, said cross section having regions which require differing amounts of shrinkage in said uniaxial direction to achieve maximum density under said pressure and heating for said amount of time, the method comprising:

a) laminating auxiliary material with said green body in said uniaxial direction, said auxiliary material having at least one non-uniform composition cross section perpendicular to said uniaxial direction, said auxiliary material cross section having regions which require differing amounts of shrinkage in said uniaxial direction to achieve maximum density under said pressure and heating for said amount of time, whereby the net uniaxial shrinkage required by the laminate to achieve maximum density under said heating and pressure for said amount of time is substantially equal across the laminate;

b) hot pressing said laminate to form a densified body; and c) delaminating said auxiliary material from said densified body.

2. The method of claim 1 wherein a portion of said auxiliary material contains a powder material which is non-sinterable during said hot pressing.

3. The method of claim 2 wherein said non-sinterable material contacts said green body.

4. The method of claim 3 wherein said non-sinterable material is present at all points of contact between said green body and said auxiliary material.

5. The method of claim 1 wherein one or more portions of said green body are substantially identical in composition to one or more portions of said auxiliary material.

6. The method of claim 5 wherein said green body and said auxiliary material are multi-layered preforms.

7. The method of claim 6 wherein the preforms each contain a layer having regions of differing composition.

8. The method of claim 1 wherein one or more portions of said auxiliary material densify during said hot pressing.

9. The method of claim 1 wherein said green body contains one or more regions of a powder material which is non-sinterable during said hot pressing.

10. The method of claim 9 further comprising
d) removing said non-sinterable material from the densified body after said delamination.

11. The method of claim 8 wherein said densified body is a part for an electronic package.

12. The method of claim 1 wherein said green body contains one or more portions which are fully densified prior to said hot pressing.

13. The method of claim 12 wherein said fully dense portions contain AlN.

14. The method of claim 13 wherein the non-sinterable material contains boron nitride powder.

15. The method of claim 1 wherein said green body is a preform for an electronic package.

16. The method of claim 1 wherein said green body is a multi-layered preform.

17. The method of claim 1 wherein at least one of said regions of said green body contains a powder selected from the group consisting of ceramic powder, metal powder, and mixtures thereof.

18. The method of claim 17 wherein said at least one region contains a ceramic powder.

19. The method of claim 18 wherein said ceramic powder is selected from the group consisting of glasses, glass-ceramics, crystalline ceramics and mixtures thereof.

* * * * *